US006543031B1

(12) United States Patent
Kamdar et al.

(10) Patent No.: US 6,543,031 B1
(45) Date of Patent: Apr. 1, 2003

(54) METHOD FOR REDUCING SIMULATION TIME TAKEN BY A CPU DURING SIGNAL INTEGRITY ANALYSIS

(75) Inventors: Ruchira Kamdar, Bangalore (IN); Narayanan Rajeev, Vellore (IN)

(73) Assignee: International Business Machines Corporation, Armonk, NY (US)

( * ) Notice: Subject to any disclaimer, the term of this patent is extended or adjusted under 35 U.S.C. 154(b) by 198 days.

(21) Appl. No.: 09/616,017

(22) Filed: Jul. 13, 2000

(51) Int. Cl.⁷ .............................................. G06F 17/50
(52) U.S. Cl. ...................... 716/2; 716/4; 716/5; 716/6
(58) Field of Search ...................... 716/2.4, 5.6; 703/13, 703/14, 17, 19

(56) References Cited

U.S. PATENT DOCUMENTS 6,209,122 B1 * 3/2001 Jyu et al. ........................ 716/6

* cited by examiner

Primary Examiner—Vuthe Siek
Assistant Examiner—Naum Levin
(74) Attorney, Agent, or Firm—T. Rao Coca

(57) ABSTRACT

A method, an apparatus, and a computer program product for reducing simulation time taken by a CPU during signal integrity analysis are disclosed. In the method, a circuit network is provided for similuation having a number of transistors. Preferably, the provided circuit network is an ANDAP, SPICE, or AS/X net. A simplified circuit network having a reduced number of transistors is generated from the provided circuit network. Transistors in the provided circuit network having the same channel length and being configured in parallel are replaced by a single transistor having corresponding aggregate characteristics for the replaced transistors. The provided circuit network is then simulated using the simplified circuit network.

12 Claims, 9 Drawing Sheets

US 6,543,031 B1

METHOD FOR REDUCING SIMULATION TIME TAKEN BY A CPU DURING SIGNAL INTEGRITY ANALYSIS

FIELD OF THE INVENTION

The present invention relates to the field of circuit simulators and in particular to signal integrity analysis of simulated circuits.

BACKGROUND

A circuit simulator is a device, data processing system, or computer program that represents features of the behaviour of a physical circuit using abstract models of the physical circuit. The solution to any problem involving circuit-level simulation by a simulator involves analyzing the circuit.

Signal integrity testing is an analysis to check the quality of the signal propagating through a transmission line from a driver end to a receiver end. The analysis checks whether the signal waveform arriving at the receiving end is the same as the waveform at the driver end. In a typical signal integrity analysis using an Automated Network Design Analysis Program (ANDAP) or AS/X models (involving the simulation AS/X net or ANDAP net which calls an input/output IO Cell), the time taken to simulate a particular net with respect to either best case/worst case is high. AS/X is a tool used to do the simulations. This simulation time depends on the transistor level circuit of the IO cells.

FIG. 1 is a transistor level diagram illustrating an ANDAP net 100 obtained using standard libraries. The net list 100 includes 12 MOSFETs, of which 6 transistors are PMOS transistors 110–120 and the remaining 6 are NMOS transistors 130–140. The PMOS transistors 110–120 share a common GATE G14. The NMOS transistors 130–140 also share a common GATE G24. The source of each PMOS transistor 110–120 is coupled to the supply voltage $V_{DD}$. Similarly, the source of each NMOS transistor 130–140 is coupled to ground. The drain of each PMOS transistor 110–120 is coupled to a corresponding one of the NMOS transistors 130–140. For example, the drains of PMOS transistor 110 and NMOS transistor 130 are coupled together. Similarly, the drain of PMOS transistor 112 is coupled to that of NMOS transistor 132, and so on. A current $I_{DS}$ flows through the configuration of transistors from the supply voltage $V_{DD}$ to the ground terminal through the parallel configurations of transistors.

In FIG. 1, the following parameters appertain:

| | |
|---|---|
| a | $I_{DS1}$, |
| b | $I_{DS1} + I_{DS2}$, |
| c | $I_{DS1} + I_{DS2} + I_{DS3}$, |
| d | $I_{DS6}$, |
| e | $I_{DS6} + I_{DS5}$, |
| f | $I_{DS6} + I_{DS5} + I_{DS4}$, |
| $I_{DSUP}$ | $I_{DSBottom}$ = c + f, |
| $PL_p$ | 0.24, |
| $PW_p$ | 9.78, |
| $PL_n$ | 0.24, |
| $PW_n$ | 9.78 |

The effective channel length is 0.18 micrometers and the channel length is 0.24 micrometers. $PW_p$ and $PW_n$ are the channel width of PMOS and NMOS transistors. $PL_p$ and $PL_n$ are the channel length of those transistors.

In signal integrity testing, the ANDAP net or AS/X net being simulated calls a particular IO cell. Internally these IO cells contain many transistors along with resistances and capacitances. So, the time to simulate such a net is high. The signal integrity analysis time for a large network 100 is high because of the large number of transistors 110–120, 130–140 that need to be simulated to arrive at the final result. The existing method of ASX, SPICE, or ANDAP simulation involves:

1. Simulating all the PMOS transistors individually; and
2. Simulating all the NMOS transistors individually.

Therefore, a need clearly exists for an improved system of performing signal integrity analysis for large circuit networks undergoing circuit simulation.

SUMMARY

In accordance with a first aspect of the invention, there is provided a method of reducing simulation time taken by a central processing unit (CPU) during signal integrity analysis. In the method, a circuit network is provided for simulation having a plurality of transistors. A simplified circuit network having a reduced number of transistors is generated from the provided circuit network. The provided circuit network may be an ANDAP, SPICE, or ASX net. Transistors having the same channel length and being configured similarly from the provided circuit network are replaced by a single transistor having corresponding aggregate characteristics for the replaced transistors. Preferably, the transistors are configured in parallel. The provided circuit network is simulated using the simplified circuit network.

In accordance with a second aspect of the invention, there is provided an apparatus for reducing simulation time taken by a central processing unit (CPU) during signal integrity analysis. The apparatus includes a device for providing a circuit network for simulation having a plurality of transistors, and a device for generating a simplified circuit network having a reduced number of transistors from the provided circuit network, where transistors having the same channel length and being configured similarly from the provided circuit network are replaced by a single transistor having corresponding aggregate characteristics for the replaced transistors.

In accordance with a third aspect of the invention, there is provided a computer program product having a computer readable medium having a computer program recorded therein for reducing simulation time taken by a central processing unit (CPU) during signal integrity analysis. The computer program product includes a computer program code module for providing a circuit network for simulation having a plurality of transistors, and a computer program code module for generating a simplified circuit network having a reduced number of transistors from the provided circuit network, where transistors having the same channel length and being configured similarly from the provided circuit network are replaced by a single transistor having corresponding aggregate characteristics for the replaced transistors.

BRIEF DESCRIPTION OF THE DRAWINGS

An embodiment of the invention is described hereinafter with reference to the drawings, in which.

DETAILED DESCRIPTION

A method, an apparatus and a computer program product for reducing simulation time taken by a central processing unit (CPU) during signal integrity analysis are disclosed. In the following description, numerous specific details are set forth. However it will be apparent, to one skilled in the art that changes and/or modifications can be made thereto without departing from the scope and spirit of the invention.

Given an extracted transistor-level IO cell circuit, an equivalent form of the same circuit (simulation model) can be obtained such that the time taken by the CPU for simulation is minimal, with little or no deviation in the end result using the embodiment of the invention.

The embodiments of the invention involve simplifying the simulation model of the IO cell circuit into a form that takes minimum time during simulation. This is done by looking into the IO cell circuit, identifying the transistor configurations and their connections, and obtaining an equivalent form. Transistors having similar characteristics (same channel lengths) and connectivity (connected in parallel) are grouped and treated as one transistor with the grouped characteristics (with the channel widths added up) for simplicity. This reduces the workload from multiple simulations to one simulation, thereby resulting in less simulation time.

Figure 1:
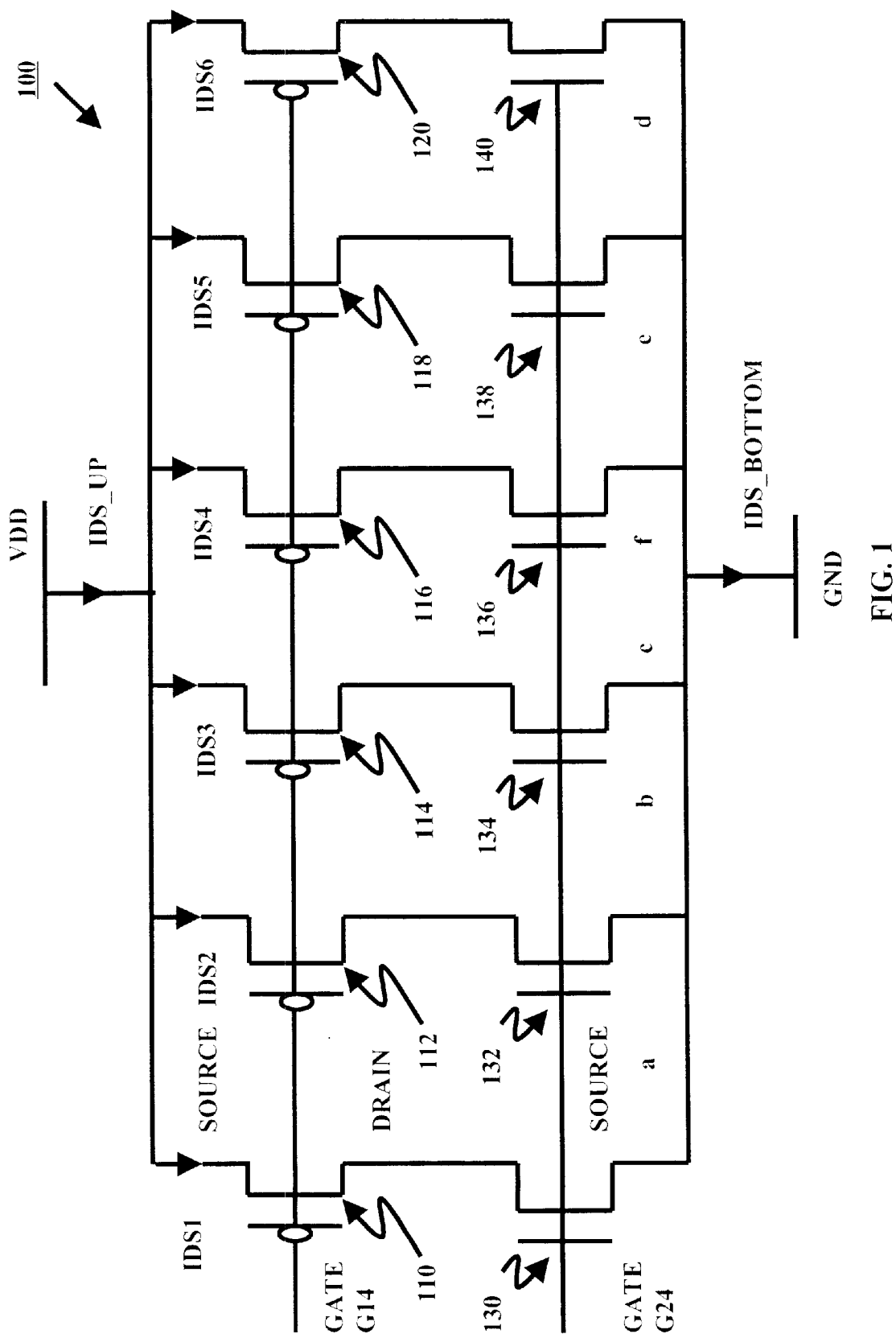
FIG. 1 is a circuit-level diagram of an example of a circuit at the transistor level taken from a standard SA12E technology I/O cell library, where SA12E technology is an IBM offered technology where the length of a transistor is 0.25 $\mu$m)

The method according to the embodiment of the invention simplifies the IO cells of FIG. 1 so as to reduce the simulation time. In this method, the circuit is analyzed and an equivalent form of the same circuit is obtained without altering the characteristics. The equivalent form of the circuit can be obtained only if the channel length PL of all the transistors are same and all the transistors are connected in parallel. A PERL Script looks into and simplifies the transistor configuration, similar to the one 200 shown in FIG. 2.

Figure 2:
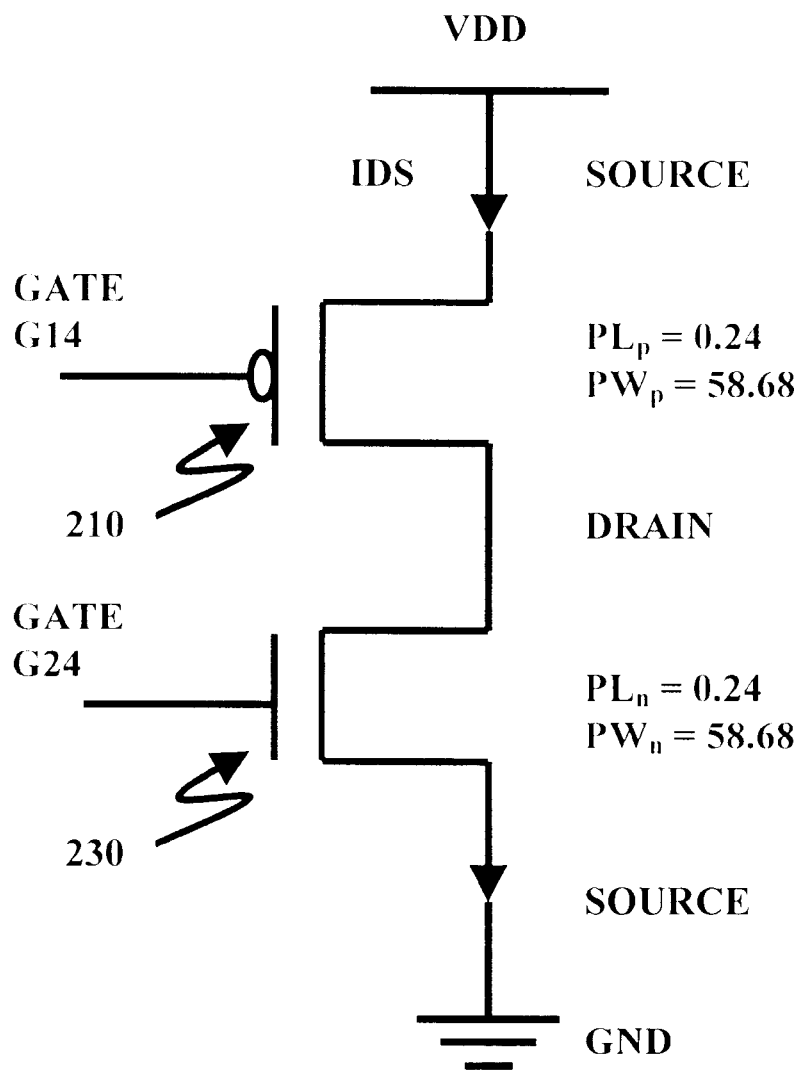
FIG. 2 is a transistor-level diagram illustrating an equivalent circuit according to the embodiment of the invention.

With reference to FIG. 2, the simulator simulates only one PMOS and one NMOS transistor 210, 230. The circuit 200 shown in FIG. 2 is a greatly simplified version of the circuit 100 shown in FIG. 1. The source of the PMOS transistor 210 is coupled to the source voltage $V_{DD}$. The drain of the PMOS transistor 210 is coupled to the drain of the NMOS transistor 230. In turn the source of the NMOS transistor 230 is coupled to ground. The PMOS and NMOS transistors 210, 230 have corresponding gates G14 and G24, respectively. The PMOS transistor 210 of circuit 200 has a channel length $PL_p$ equal to 0.24 and a channel width $PW_p$ equal to 58.68. The NMOS transistor 230 has corresponding values as well.

The currents through the PMOS and NMOS transistors of FIG. 1 in saturation are given by:

$$IDSP[1]=0.5*up*Cox*PWP/PLP\ (VGSP-VTP)^2 \quad (1)$$

$$IDSN[1]=0.5*un*Cox*PWn/PLn\ (VGSn-VTn)^2 \quad (2)$$

where:

| | |
|---|---|
| IDSP, IDSN | Drain to Source Current of PMOS and NMOS respectively; |
| up, un | Mobility of Electron and Holes respectively; |
| COX | Oxide Thickness; |
| PWP, PWN | Channel Width of PMOS and NMOS respectively; |
| PLP, PLN | Channel Length of PMOS and NMOS respectively; |
| VGSP, VGSN | Gate to Source Voltage of PMOS and NMOS respectively; |
| VTn, VTp | Threshold Voltage of PMOS and NMOS respectively; |
| VG14 | Gate to Source Voltage at G14 node (See FIG. 1); |
| VG24 | Gate to Source Voltage at G24 node (See FIG. 1); |
| VSN | Source Voltage; |
| VGN | Gate Voltage. |

The following values are used:

VG14=VG24=5 volts,

Vtn=1 volt,

Vtp=1 volt, up=1500 cm$^2$/v-sec, un=500 cm$^2$/v-sec,

COX=1.726*10−7 F/cm$^2$,

VGND=0 volts.

Figure 3:
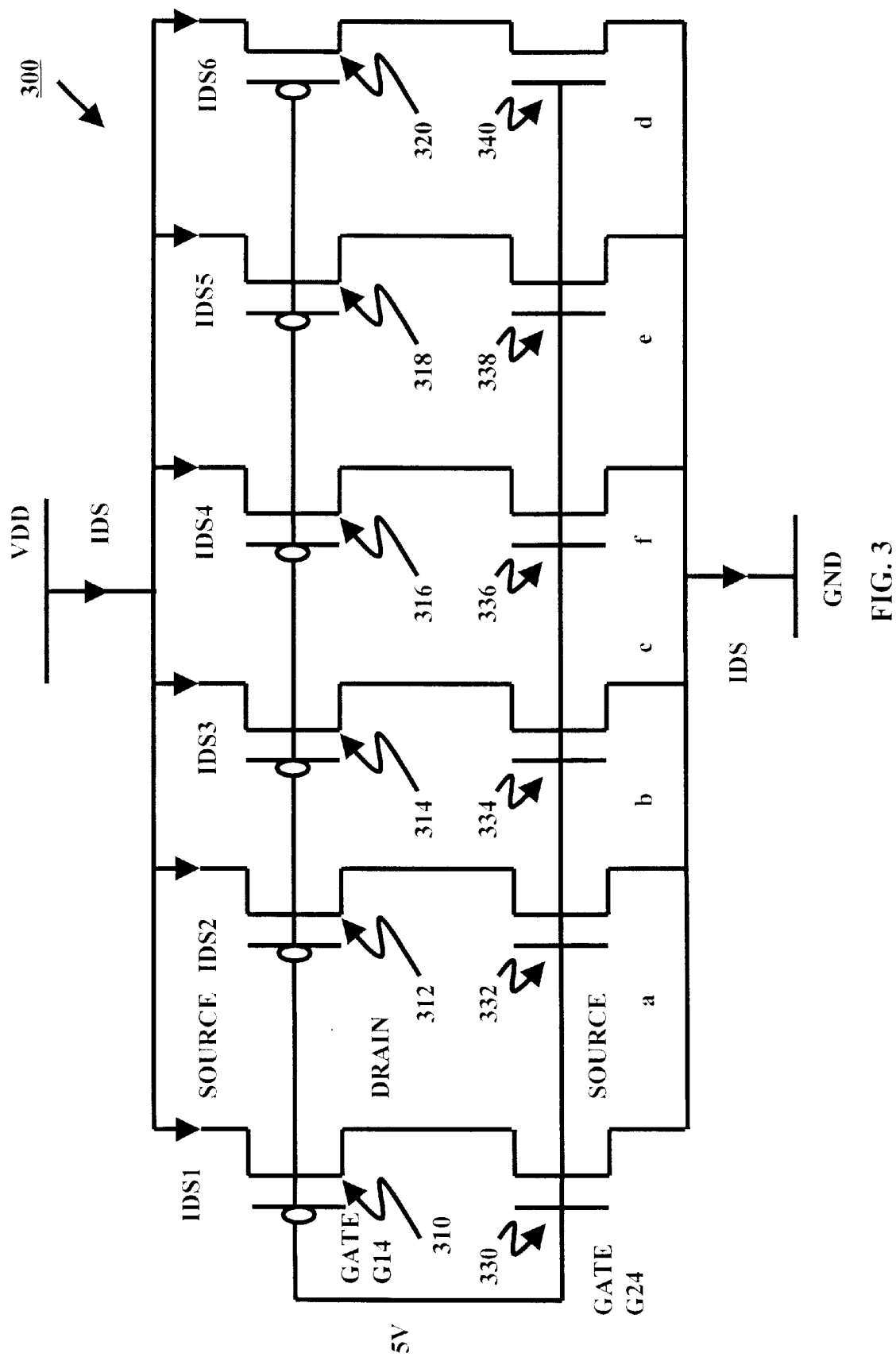
FIG. 3 is a circuit-level diagram of the circuit of FIG. 1 where the input gates are connected to a 5 volt supply.

With VG14=VG24, the equivalent circuit for FIG. 1 is shown in FIG. 3. The elements of FIG. 3 have corresponding reference numerals starting with a "3" rather than a "1". Other than both gates G14 and G24 having a voltage of 5V applied, the circuits 100 and 300 of FIGS. 1 and 3 are the same. In FIG. 3, each PMOS transistor is in series with a corresponding NMOS transistor so the currents in NMOS and PMOS are equal:

$$IDSP=IDSN \quad (3)$$

Using Equation 2 for FIG. 3,

VGSN=VGN−VSN=VG14−VGND=5−0=5 volts

The Drain to Source Current is given by:

IDS1=IDS2=IDS3=IDS4=IDS5=IDS6=500*1.726*10−7*(9.78/(2*0.24))*(5−1)2

IDS1=IDS2=IDS3=IDS4=IDS5=IDS6=0.0281338 amps.

Since there are 6 pairs of NMOS and PMOS transistors connected in parallel in FIG. 3, the total current is given by, IDS=6*0.0281338=0.1688028 amps.

Using Equation 2 for FIG. 2,

IDS=500*1.726*10−7*(58.68/(2*0.24))*(5−1)$^2$

IDS=0.1688028 amps.

The above analysis demonstrates the operation of the embodiment of the invention.

FIGS. 4A–4D show a single driver 410 driving different receivers with different configurations. The right hand side of FIGS. 4A–4D shows the receiver, while the left hand side shows the driver model 410. A common system is used preferably in which the ANDAP net calls an IO cell sa12e__bc2520__a. Considering the driving capabilities of the driver 410, the number of receivers is increased from one to four in FIGS. 4A–4D.

Figure 4A:
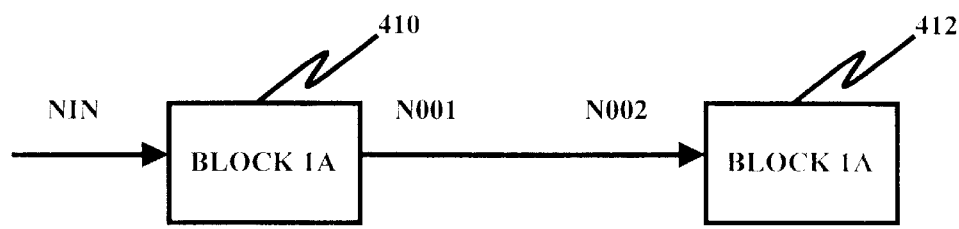
FIGS. 4A–4D are block diagrams illustrating a single driver driving different receivers with different configurations in accordance with the embodiment of the invention.
Figure 4B:
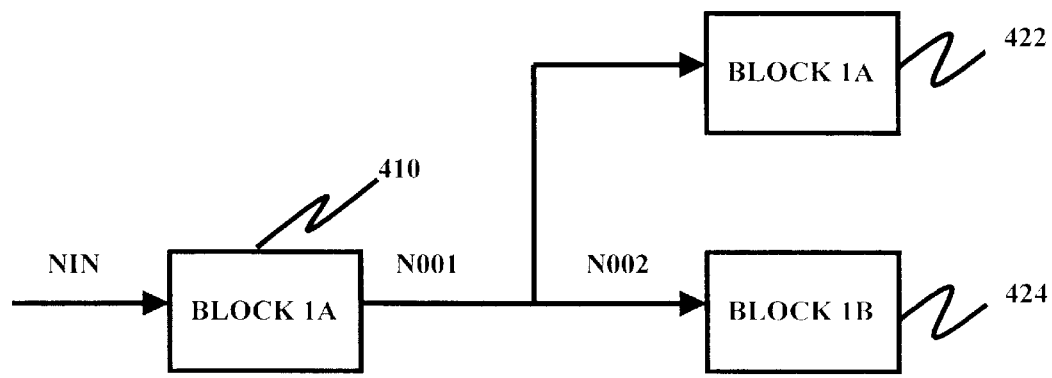

In FIGS. 4A–4B, each of the blocks 410, 412, 422, 424, 432–436 and 442–448 is implemented using the circuits of FIG. 1 and FIG. 2 for purposes of comparison. Each block is correspondingly labelled "BLOCK 1" with a corresponding character "A", "B", "C", or "D" to distinguish the various multiple versions of the circuit.

| | |
|---|---|
| N001 | Output Voltage at the Driver End, |
| N002 | Input Voltage at the Receiver End, and |
| MN | Input Voltage at the Driver End. |

Figure 4C:
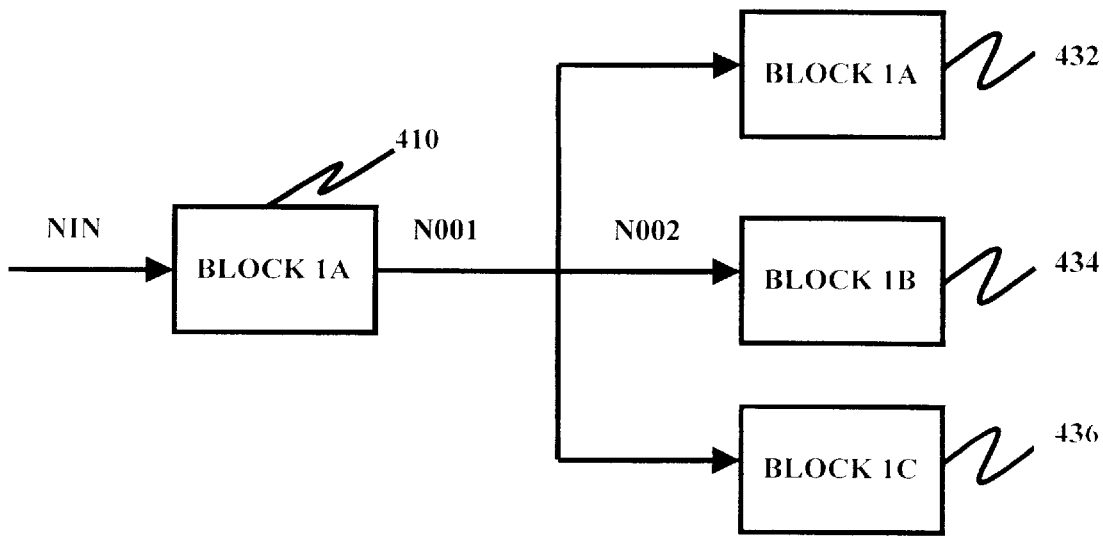
Figure 4D:
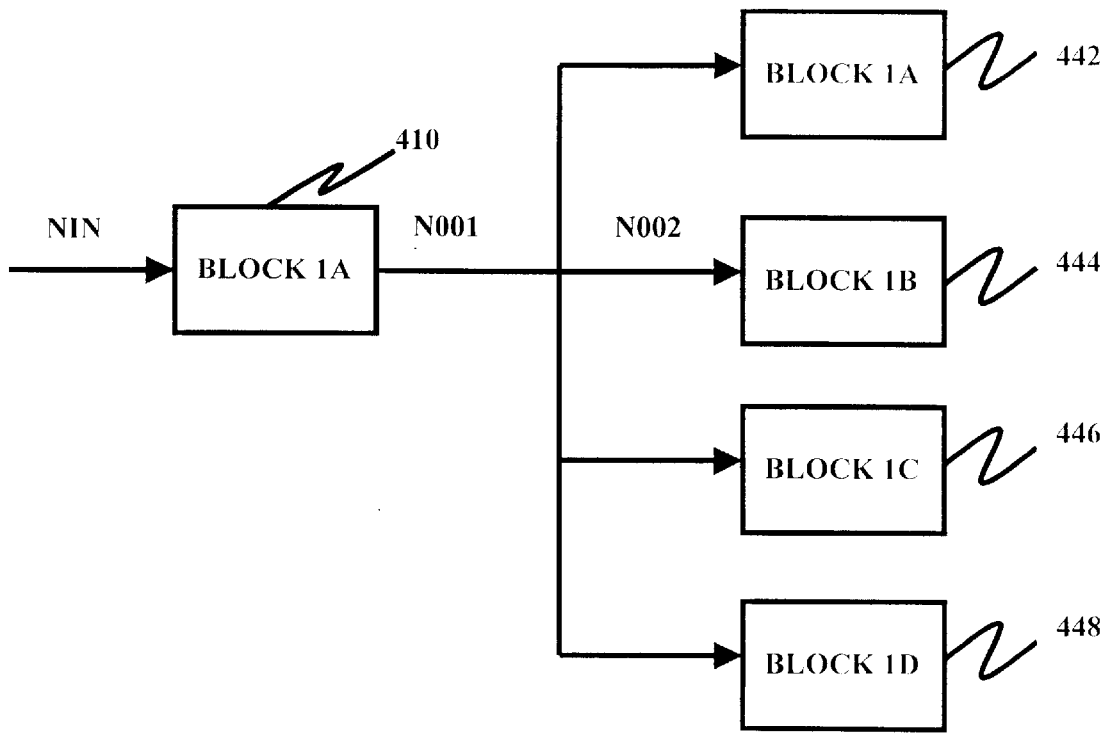

In FIG. 4A, the block 410 drives a single block 412. In FIG. 4B, the single block 410 drives two blocks 422 and 424. In FIG. 4C, the single block 410 drives three blocks 432, 434 and 436. In FIG. 4D, the single block 410 drives four blocks 442, 444, 446, and 448.

Using the above technique, the results listed in Table 1 clearly show the difference of using the simplified model 200 according to the embodiment of the invention in contrast to the actual model 100 of FIG. 1 from the conventional method of simulation. The transistor configuration shown in FIG. 1 represents only part of the circuit of a particular IO cell. The entire circuit in that IO cell has a transistor configuration similar to the one shown in FIG. 1 except for the node names being changed. Table 1 gives an entry for the total number of transistors of the entire IO cell taken into consideration.

Figure 6:
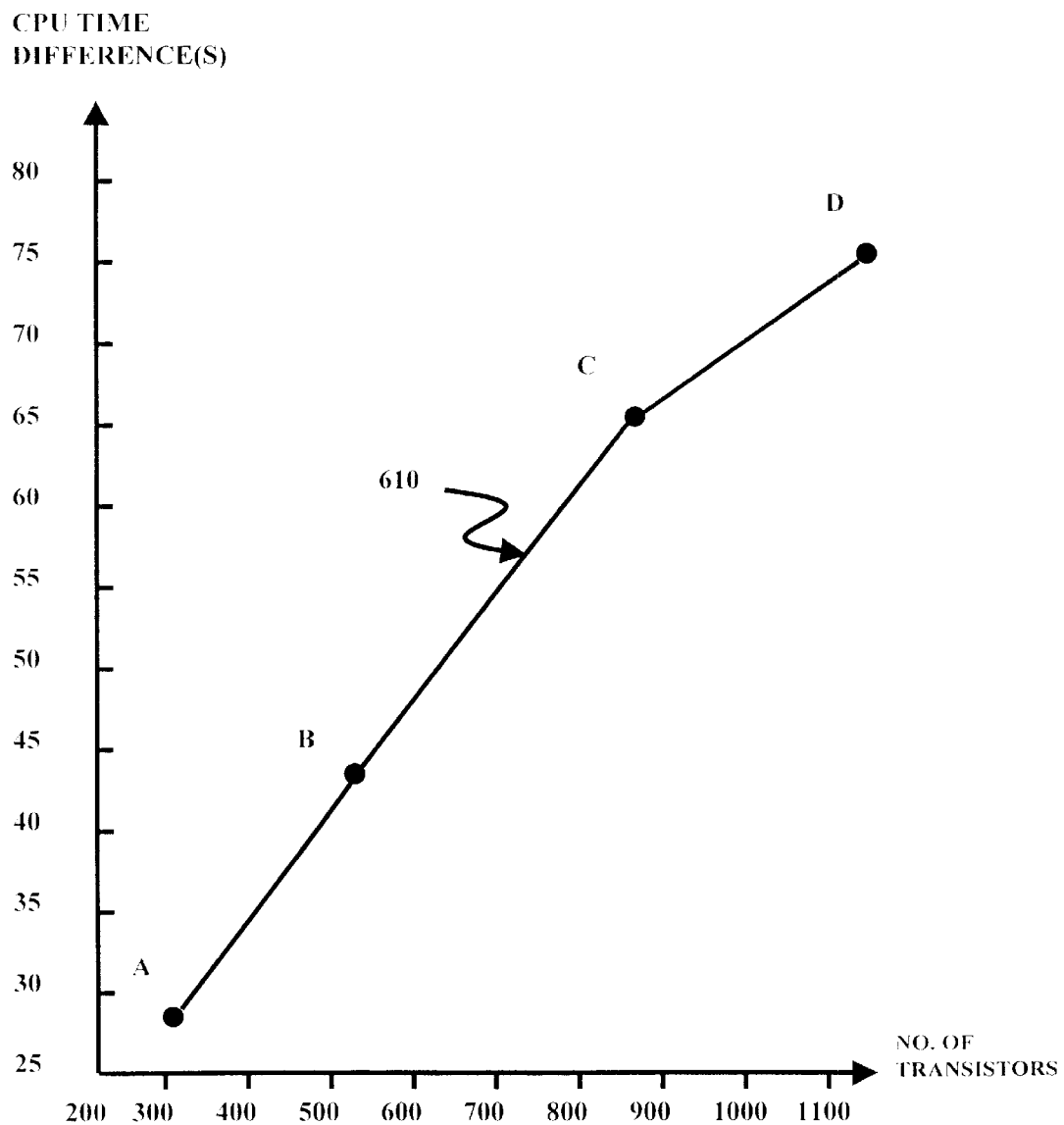
FIG. 6 is a graph showing the time difference in seconds with respect to the number of transistors of the actual model of FIG. 1 and the simplified model of FIG. 2.

FIG. 6 is a corresponding graph showing the time difference in seconds with respect to the number of transistors.

Figure 7:
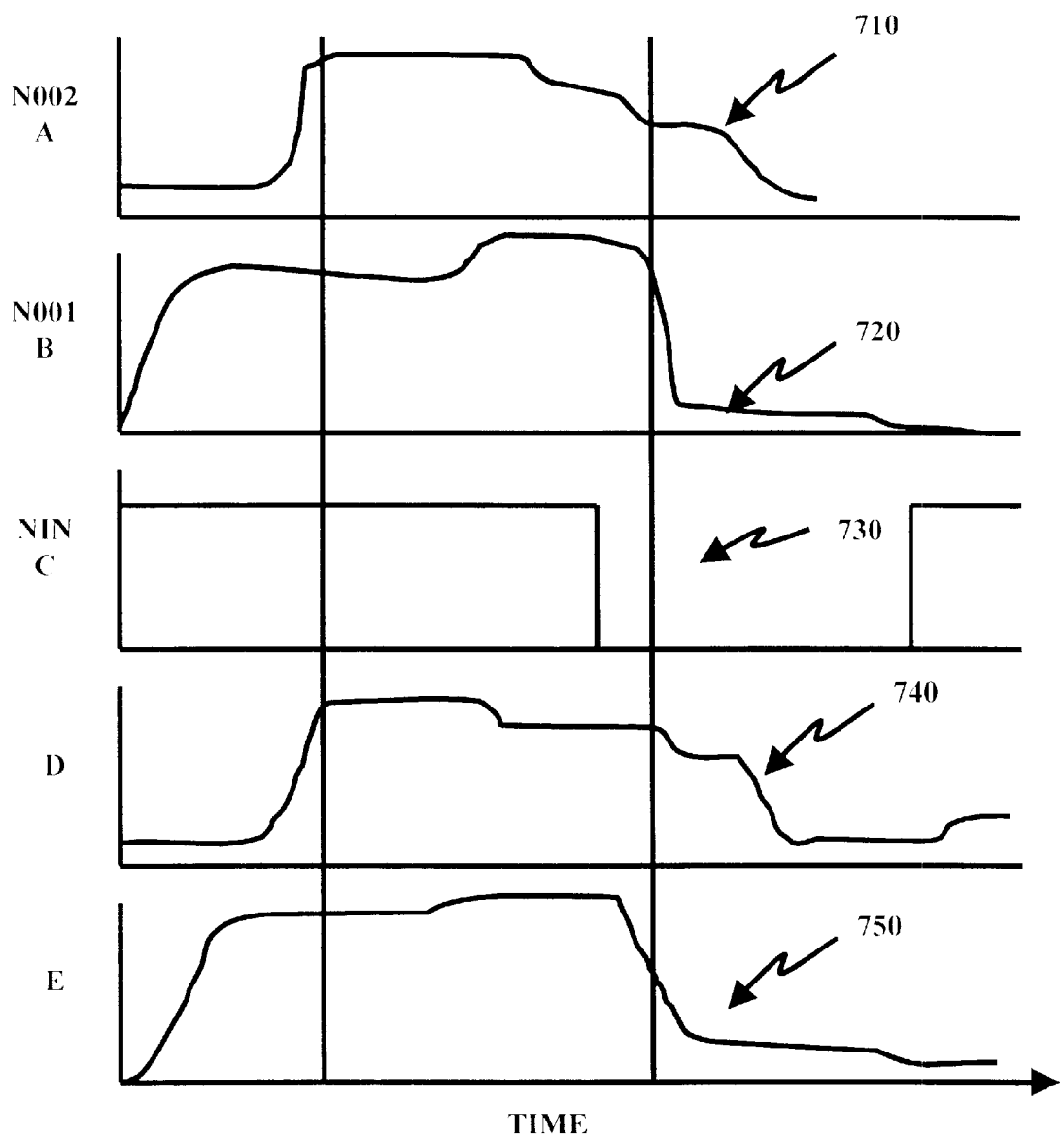
FIG. 7 is a signal diagram showing the variations of output and input voltages with respect to time for the circuit of FIG. 4A using the actual model of FIG. 1 and the simplified model of FIG. 2.

FIG. 7 shows the variation of output and input voltages with respect to time for the first circuit under testing of FIG. 4A. FIG. 7A illustrates the signal at the input of the receiver 412 for the actual model 100 of FIG. 1. FIG. 7B shows the signal at the output of driver 410 for the actual model 100. FIG. 7C illustrates the signal input to the driver 410 for both the actual and simplified models of FIGS. 1 and 2. FIG. 7D illustrates the signal at the input of the receiver 412 for the simplified model 200 of FIG. 2 according to the embodiment of the invention. Finally, FIG. 7E illustrates the signal at the output of the driver 410 for the simplified model 200 according to the embodiment of the invention shown in FIG. 2.

Figure 8:
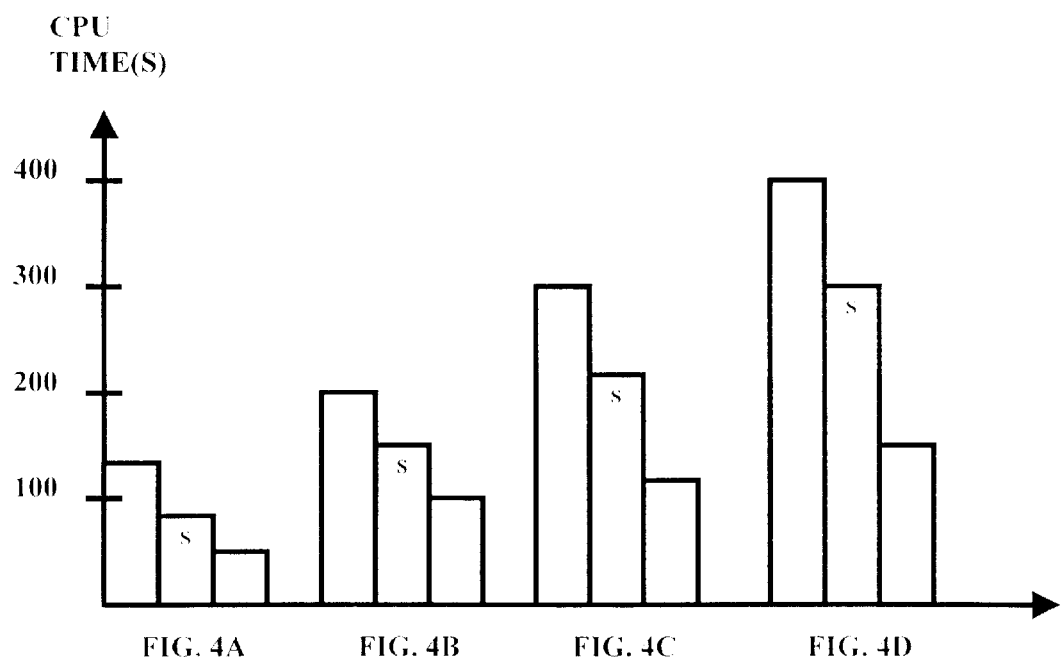
FIG. 8 is a bar chart showing the CPU time taken by the actual model of FIG. 1 and the simplified model of FIG. 2.

FIG. 8 is a bar chart showing CPU time taken and saved by the actual (A) and simplified (S) models of FIGS. 1 and 2 respectively. The vertical axis is the time taken by the CPU during simulation and is in seconds. Also shown is the time difference (D) saved by the simplified model. As can be seen, the time difference is significantly greater for the larger circuit of FIG. 4D than FIG. 4A.

Figure 9:
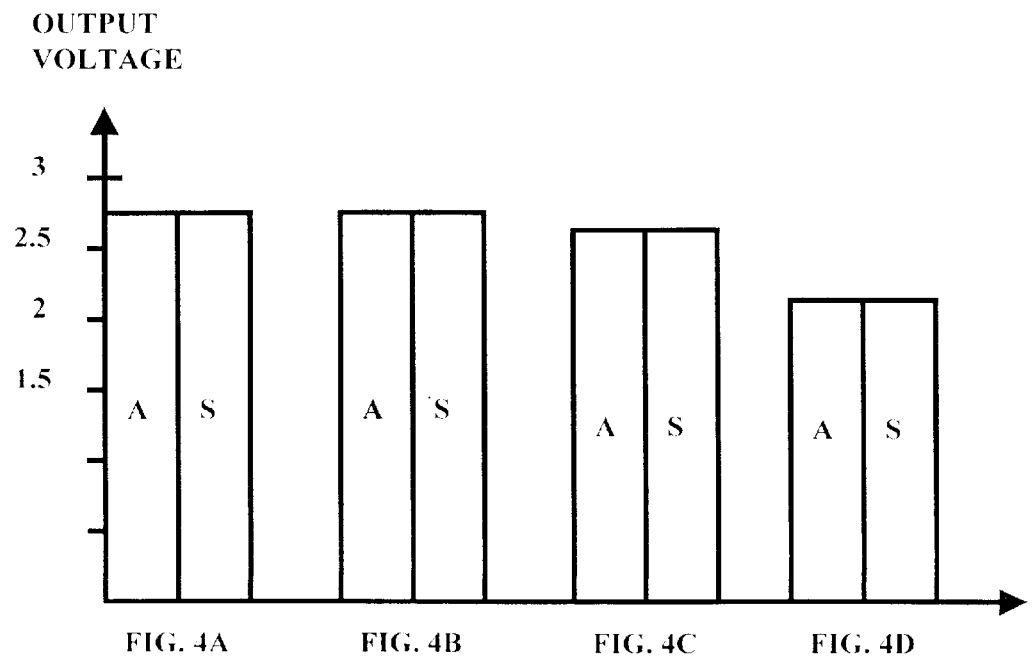
FIG. 9 is a bar chart showing the accuracy of voltages between the actual model of FIG. 1 and the simplified model of FIG. 2.

FIG. 9 is a block diagram illustrating the accuracy in voltages between the actual (A) and simplified (S) models 100, 200 of FIGS. 1 and 2, respectively.

From the foregoing, the performance of the system improves manifold for larger circuits if the above method is implemented. The implementation is specific to signal integrity analysis. Thus, by tracing the circuit of each IO cells, the simplification of the circuit can be done so that system performance is increased to the maximum extent possible.

The above example illustrates the performance gain obtained for an ANDAP net which uses sa12e__bc2520__a IO cell. This can be generalized for any other circuit, so that any large circuit can be simplified into a form which takes the minimum CPU time for simulation.

The method for reducing simulation time taken by a CPU during signal integrity analysis can be implemented in

TABLE 1

| Circuit Under Test | Number of Transistors | Time (CPU) without simplification (FIG. 1) | Time (CPU) with simplification (FIG. 2) | % CPU Saving | Accuracy | | |
|---|---|---|---|---|---|---|---|
| | | | | | Ref | Pro | Deg |
| FIG. 4A | 279 | 121.20 sec | 92.70 sec | 23.51 | 2.6766 2.6788 (v) | (v) | −2.2 |
| FIG. 4B | 558 | 180.02 sec | 135.73 sec | 24.60 | 2.6851 2.6866 (v) | (v) | −1.5 |
| FIG. 4C | 837 | 266.57 sec | 202.66 sec | 23.97 | 2.5462 2.5471 (v) | (v) | −0.9 |
| FIG. 4D | 1083 | 369.14 sec | 292.95 sec | 20.63 | 2.3001 2.3003 (v) | (v) | −0.2 |

Table 1 shows the variation of the CPU time for different transistor counts.
Ref — Reference method of FIG. 1 value in volts.
Pro — Method of invention of FIG. 2 value in volts.
Deg — Degradation/Deviation of reference and proposed method voltages.

Figure 5:
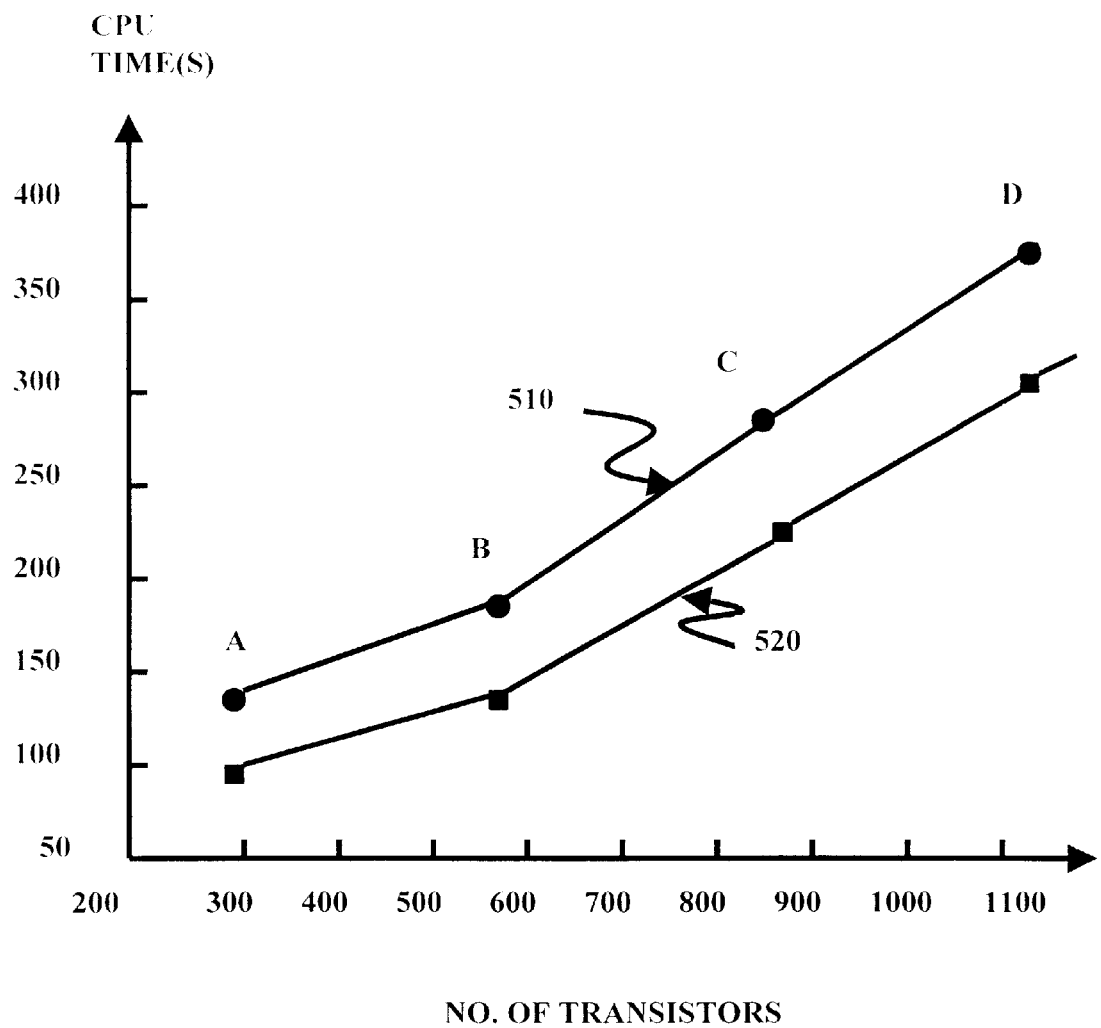
FIG. 5 is a chart showing the CPU time in seconds dependent on the number of transistors for the actual model of FIG. 1 and the simplified model of FIG. 2.

FIG. 5 shows the CPU time in seconds for the actual model 100 of FIG. 1 and the simplified model 200 of FIG. 2. The points A, B, C, and D are for the various circuits under test of FIGS. 4A, 4B, 4C and 4D, respectively. The curve 510 illustrates the CPU time for the actual model of FIG. 1, whereas the curve 520 of FIG. 5 illustrates the same for the simplified model of FIG. 2.

modules. A module, and in particular its functionality, can be implemented in either hardware or software. In the software sense, a module is a process, program, or portion thereof, that usually performs a particular function or related functions. In the hardware sense, a module is a functional hardware unit designed for use with other components or modules. For example, a module may be implemented using discrete electronic components, or it can form a portion of an entire electronic circuit such as an Application Specific Integrated Circuit (ASIC). Numerous other possibilities exist. Those skilled in the art will appreciate that the system can also be implemented as a combination of hardware and software modules.

The embodiment of the invention is preferably implemented using a general-purpose computer. In particular, the processing or functionality of the method according to the embodiment of the invention can be implemented as software, or a computer program, executing on the computer. The method or process steps for reducing simulation time taken by a CPU during signal integrity analysis are effected by instructions in the software that are carried out by the computer. The software may be implemented as one or more modules for implementing the process steps. A module is a part of a computer program that usually performs a particular function or related functions. Also, as described hereinbefore, a module can also be a packaged functional hardware unit for use with other components or modules. More preferably, the process of the embodiment of the invention is implemented as a module of circuit-level simulation software.

In particular, the software may be stored in a computer readable medium, including the storage devices described below. The software is preferably loaded into the computer from the computer readable medium and then carried out by the computer. A computer program product includes a computer readable medium having such software or a computer program recorded on it that can be carried out by a computer. The use of the computer program product in the computer preferably effects advantageous apparatuses for reducing simulation time taken by a CPU during signal integrity analysis in accordance with the embodiment of the invention.

Preferably, a computer system consists of the computer, a video display, and input devices. In addition, the computer system can have any of a number of other output devices including line printers, laser printers, plotters, and other reproduction devices connected to the computer. The computer system can be connected to one or more other computers via a communication interface using an appropriate communication channel such as a modem communications path, a computer network, or the like. The computer network may include a local area network (LAN), a wide area network (WAN), an Intranet, and/or the Internet.

The computer itself consists of a central processing unit(s) (simply referred to as a processor hereinafter), a memory which may include random access memory (RAM) and read-only memory (ROM), input/output (IO) interfaces, a video interface, and one or more storage devices. The storage device(s) can consist of one or more of the following: a floppy disc, a hard disc drive, a magneto-optical disc drive, CD-ROM, magnetic tape or any other of a number of non-volatile storage devices well known to those skilled in the art. Each of the components is typically connected to one or more of the other devices via a bus that in turn can consist of data, address, and control buses.

The video interface is connected to the video display and provides video signals from the computer for display on the video display. User input to operate the computer can be provided by one or more input devices. For example, an operator can use the keyboard and/or a pointing device such as the mouse to provide input to the computer.

The system is simply provided for illustrative purposes and other configurations can be employed without departing from the scope and spirit of the invention. Computers with which the embodiment can be practiced include IBM-PC/ATs or compatibles, one of the Macintosh (TM) family of PCs, Sun Sparcstation (TM), a workstation or the like. The foregoing is merely exemplary of the types of computers with which the embodiments of the invention may be practiced. Typically, the processes of the embodiments, described hereinafter, are resident as software or a program recorded on a hard disk drive as the computer readable medium, and read and controlled using the processor. Intermediate storage of the program and intermediate data and any data fetched from the network may be accomplished using the semiconductor memory, possibly in concert with the hard disk drive.

In some instances, the program may be supplied to the user encoded on a CD-ROM or a floppy disk, or alternatively could be read by the user from the network via a modem device connected to the computer, for example. Still further, the software can also be loaded into the computer system from other computer readable medium including magnetic tape, a ROM or integrated circuit, a magneto-optical disk, a radio or infra-red transmission channel between the computer and another device, a computer readable card such as a PCMCIA card, and the Internet and Intranets including email transmissions and information recorded on websites and the like. The foregoing is merely exemplary of relevant computer readable mediums. Other computer readable mediums may be practiced without departing from the scope and spirit of the invention.

In accordance with the foregoing, a method, an apparatus, and a computer program product for reducing simulation time taken by a CPU during signal integrity analysis are disclosed. While only a small number of embodiments have been described, it will be apparent to those skilled in the art in view of this disclosure that modifications and/or changes can be made thereto without departing from the scope and spirit of the invention.

We claim:

1. A method of reducing simulation time taken by a central processing unit (CPU) during signal integrity analysis, said method including the steps of:

providing a circuit network for simulation having a plurality of transistors; and generating a simplified circuit network having a reduced number of transistors from said provided circuit network, where transistors having the same channel length and being configured similarly from said provided circuit network are replaced by a single transistor having corresponding aggregate characteristics for said replaced transistors.

2. The method according to claim 1, further including the step of:

simulating said provided circuit network using said simplified circuit network.

3. The method according to claim 1, wherein said transistors are configured in parallel.

4. The method according to claim 1, wherein said provided circuit network is an ANDAP, SPICE, or ASX net.

5. An apparatus for reducing simulation time taken by a central processing unit (CPU) during signal integrity analysis, said apparatus including:

means for providing a circuit network for simulation having a plurality of transistors; and means for generating a simplified circuit network having a reduced number of transistors from said provided circuit network, where transistors having the same channel length and being configured similarly from said provided circuit network are replaced by a single transistor having corresponding aggregate characteristics for said replaced transistors.

6. The apparatus according to claim 5, further including:

means for simulating said provided circuit network using said simplified circuit network.

7. The apparatus according to claim 5, wherein said transistors are configured in parallel.

8. The apparatus according to claim 5, wherein said provided circuit network is an ANDAP, SPICE, or ASX net.

9. A computer program product having a computer readable medium having a computer program recorded therein for reducing simulation time taken by a central processing unit (CPU) during signal integrity analysis, said computer program product including:

computer program code means for providing a circuit network for simulation having a plurality of transistors; and computer program code means for generating a simplified circuit network having a reduced number of transistors from said provided circuit network, where transistors having the same channel length and being configured similarly from said provided circuit network are replaced by a single transistor having corresponding aggregate characteristics for said replaced transistors.

10. The computer program product according to claim 9, further including:

computer program code means for simulating said provided circuit network using said simplified circuit network.

11. The computer program product according to claim 9, wherein said transistors are configured in parallel.

12. The computer program product according to claim 9, wherein said provided circuit network is an ANDAP, SPICE, or ASX net.

* * * * *